United States Patent
Sasaki

(10) Patent No.: US 10,482,987 B2
(45) Date of Patent: Nov. 19, 2019

(54) MAGNETIC WALL UTILIZATION SPIN MOSFET AND MAGNETIC WALL UTILIZATION ANALOG MEMORY

(71) Applicant: TDK CORPORATION, Tokyo (JP)

(72) Inventor: Tomoyuki Sasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 15/781,836

(22) PCT Filed: Apr. 14, 2017

(86) PCT No.: PCT/JP2017/015264
§ 371 (c)(1),
(2) Date: Jun. 6, 2018

(87) PCT Pub. No.: WO2017/183574
PCT Pub. Date: Oct. 26, 2017

(65) Prior Publication Data
US 2018/0358105 A1     Dec. 13, 2018

(30) Foreign Application Priority Data
Apr. 21, 2016  (JP) ................. 2016-085531

(51) Int. Cl.
*G11C 19/14*    (2006.01)
*H01L 43/08*    (2006.01)
(Continued)

(52) U.S. Cl.
CPC ............ *G11C 19/14* (2013.01); *G11C 11/161* (2013.01); *G11C 11/1659* (2013.01);
(Continued)

(58) Field of Classification Search
None
See application file for complete search history.

(56) References Cited

U.S. PATENT DOCUMENTS

| 2008/0061332 | A1* | 3/2008 | Saito | B82Y 25/00 257/295 |
| 2010/0019798 | A1* | 1/2010 | Saito | B82Y 25/00 326/49 |

(Continued)

FOREIGN PATENT DOCUMENTS

| JP | 2009-158592 A | 7/2009 |
| JP | 2015-088669 A | 5/2015 |

(Continued)

OTHER PUBLICATIONS

Jun. 27, 2017 International Search Report issued in International Patent Application No. PCT/JP2017/015264.

*Primary Examiner* — J. H. Hur
(74) *Attorney, Agent, or Firm* — Oliff PLC

(57) ABSTRACT

A magnetic wall utilization spin MOSFET includes a magnetic wall driving layer including a magnetic wall, a first region, a second region, and a third region located between the first region and the second region, a channel layer, a magnetization free layer provided at a first end portion of a first surface of the channel layer, and arranged so as to be in contact with the third region of the magnetic wall driving layer, a magnetization fixed layer provided at a second end portion opposite to the first end portion, and a gate electrode provided between the first end portion and the second end portion of the channel layer through a gate insulating layer.

14 Claims, 10 Drawing Sheets

(51) Int. Cl.
   *G11C 11/16* (2006.01)
   *G11C 11/54* (2006.01)
   *G11C 11/56* (2006.01)
   *G11C 27/00* (2006.01)
   *H01L 27/22* (2006.01)
   *H01L 43/02* (2006.01)
   *G11C 19/08* (2006.01)
   *H01L 29/66* (2006.01)
   *G06N 3/063* (2006.01)

(52) U.S. Cl.
   CPC ...... *G11C 11/1673* (2013.01); *G11C 11/1675* (2013.01); *G11C 11/54* (2013.01); *G11C 11/5607* (2013.01); *G11C 19/0808* (2013.01); *G11C 19/0841* (2013.01); *G11C 27/00* (2013.01); *H01L 27/228* (2013.01); *H01L 29/66984* (2013.01); *H01L 43/02* (2013.01); *H01L 43/08* (2013.01); *G06N 3/063* (2013.01)

(56) References Cited

U.S. PATENT DOCUMENTS

| | | | |
|---|---|---|---|
| 2010/0072528 A1* | 3/2010 | Inokuchi | H01L 29/66984 257/295 |
| 2010/0193889 A1* | 8/2010 | Nagahara | B82Y 10/00 257/421 |
| 2010/0237317 A1 | 9/2010 | Tsunoda | |
| 2010/0244897 A1* | 9/2010 | Saito | G11C 11/16 326/49 |
| 2010/0254183 A1 | 10/2010 | Fukami et al. | |
| 2011/0096593 A1* | 4/2011 | Ranjan | G11C 11/5607 365/158 |
| 2011/0129691 A1 | 6/2011 | Ishiwata et al. | |
| 2011/0292718 A1* | 12/2011 | Suzuki | G11C 11/16 365/158 |
| 2013/0140660 A1* | 6/2013 | Fukami | G11C 11/14 257/421 |

FOREIGN PATENT DOCUMENTS

| | | |
|---|---|---|
| JP | 2016-004924 A | 1/2016 |
| WO | 2009/054180 A1 | 4/2009 |
| WO | 2009/072213 A1 | 6/2009 |
| WO | 2009/101827 A1 | 8/2009 |

* cited by examiner

MAGNETIC WALL UTILIZATION SPIN MOSFET AND MAGNETIC WALL UTILIZATION ANALOG MEMORY

TECHNICAL FIELD

The present invention relates to a magnetic wall utilization spin MOSFET and a magnetic wall utilization analog memory.

Priority is claimed on Japanese Patent Application No. 2016-085531 filed in Japan on Apr. 21, 2016, the contents of which are incorporated herein by reference.

BACKGROUND ART

As a next-generation nonvolatile memory substituting for a flash memory or the like which has come to have a limit in miniaturization, a resistance change memory for storing data by using a resistance variable element, such as MRAM (Magnetoresistive Random Access Memory), ReRAM (Resistance Random Access Memory), PCRAM (Phase Change Random Access Memory), and the like attracts attention.

As a method of increasing the memory density (increasing capacity), there is a method of reducing the size of the elements constituting the memory, as well as a method of multileveling the recording bits per element constituting the memory, and various multileveling methods have been proposed (for example, see Patent Documents 1 to 3).

There is one type of MRAM called a magnetic wall driving type or a magnetic wall shifting type (for example, see Patent Document 4). The magnetic wall driving MRAM allows current to flow in an in-plane direction of a magnetic wall driving layer (or magnetization free layer), shifts the magnetic wall by the spin transfer effect of spin polarized electrons, and reverses the magnetization direction of the ferromagnetic film according to the direction of the write current and writes data.

Patent Document 4 describes a method of multilevel recording and analog recording with respect to a magnetic wall driving MRAM.

In MRAM, different writing methods of data have been proposed, and in addition to a magnetic wall driving MRAM, a magnetic field writing MRAM, a yoke magnetic field writing MRAM, an STT (Spin Transfer Torque) MRAM, an SOT (Spin Orbit Torque) MRAM, and the like are known.

On the other hand, a spin MOSFET has attracted attention, which has a function of a magnetoresistive effect element added to the function of an ordinary MOSFET by using a conventional MOSFET as a base and using a magnetic material for a source electrode and a drain electrode (see, for example, Patent Document 5).

PRIOR ART DOCUMENTS

Patent Documents

[Patent Document 1] Japanese Unexamined Patent Application, First Publication No. 2015-088669
[Patent Document 2] International Publication No. 2009/072213
[Patent Document 3] Japanese Unexamined Patent Application, First Publication No. 2016-004924
[Patent Document 4] International Publication No. 2009/101827
[Patent Document 5] Japanese Unexamined Patent Application, First Publication No. 2009-158592
[Patent Document 6] International Publication No. 2009/054180

DISCLOSURE OF INVENTION

Problems to be Solved by the Invention

Patent Document 4 discloses a method of writing information in a multivalued manner or an analog manner with respect to a magnetic wall driving MRAM. However, in the conventional magnetic wall driving MRAM, it is necessary to flow a current in the in-plane direction of the magnetic wall driving layer at the time of reading, so that the magnetic wall of the magnetic wall driving layer may shift due to the current flowing at the time of reading. When the magnetic wall shifts outside the portion where the magnetic wall driving layer and the magnetoresistive effect element overlap, the signal finally becomes a digital signal of 0 or 1 in the magnetic wall driving MRAM, and it is difficult to use the magnetic wall driving MRAM as an analog memory.

Conversely, if the magnetic wall shift is not completed outside the portion where the magnetic wall driving layer (or the magnetization free layer) and the magnetoresistance effect element overlap, the magnetic wall shifts during reading to erroneously write or read out initial signal changes. That is, in the conventional magnetic wall driving MRAM, there is no way to stably read data even if data can be written in a multivalued or analog manner. If the data written analogically can be read stably, it is possible to stably read data written in a multilevel manner.

Also, no attempt has been made to combine the magnetic wall driving MRAM technology with the spin MOSFET technology.

The present invention has been made in view of the above circumstances, and provides a magnetic wall utilization spin MOSFET and a magnetic wall utilization analog memory capable of stably reading out the analog recording data and amplifying an output signal with one element.

Means for Solving the Problems

A first aspect of the present invention is a magnetic wall driving layer including a magnetic wall, a first region, a second region, and a third region located between the first region and the second region, a channel layer, a magnetization free layer provided at a first end portion of a first surface of the channel layer, and arranged so as to be in contact with the third region of the magnetic wall driving layer, a magnetization fixed layer provided at a second end portion opposite to the first end portion, and a gate electrode provided between the first end portion and the second end portion of the channel layer through a gate insulating layer.

A second aspect of the present invention is the magnetic wall utilization spin MOSFET according to the first aspect, which may include an readout electrode layer provided at a position overlapping the magnetization free layer in plan view on a fourth surface opposite to the third surface on which the magnetization free layer is provided in the third region of the magnetic wall drive layer.

A third aspect of the present invention is the magnetic wall utilization spin MOSFET according to the first or second aspect, which may include a tunnel barrier layer between at least one of the magnetization free layer and the magnetization fixed layer and the channel layer.

A fourth aspect of the present invention is the magnetic wall utilization spin MOSFET according to any one of the first to third aspect, which may further include the magnetic wall drive layer and a high resistance layer between a readout electrode layer arranged at a position overlapping with the magnetization free layer in plan view.

A fifth aspect of the present invention is the magnetic wall utilization spin MOSFET according to any one of the first to fourth aspects, where the length of the magnetic wall driving layer may be 60 nm or more.

A sixth aspect of the present invention is the magnetic wall utilization spin MOSFET according to any one of the first to fifth aspects, which may include a first magnetization supply layer which is in contact with the first region and has a first magnetization direction, and a second magnetization supply layer which is in contact with the second region and has a second magnetization direction opposite to the first magnetization direction.

A seventh aspect of the present invention is the magnetic wall utilization spin MOSFET according to the sixth aspect, where a magnetization orientation of each of the magnetic wall driving layer, the first magnetization supplying layer, the second magnetization supplying layer, the magnetization free layer, and the magnetization fixed layer may be parallel to each of the corresponding layers.

An eighth aspect of the present invention is the magnetic wall utilization spin MOSFET according to the sixth aspect, where a magnetization orientation of each of the magnetic wall driving layer, the first magnetization supplying layer, the second magnetization supplying layer, the magnetization free layer, and the magnetization fixed layer may be perpendicular to each of the corresponding layers.

A ninth aspect of the present invention is the magnetic wall utilization spin MOSFET according to any one of the first to eighth aspects, where the magnetic wall driving layer may have a magnetic wall trapping portion.

A tenth aspect of the present invention is the magnetic wall utilization spin MOSFET according to any one of the sixth to ninth aspects, where a bipolar element may be connected in either one of the first magnetization supply layer and the second magnetization supply layer.

An eleventh aspect of the present invention is a magnetic wall utilization analog memory including a plurality of magnetic wall utilization spin MOSFETs according to any one of the first to tenth aspects.

A twelfth aspect of the present invention is the magnetic wall utilization analog memory according to the eleventh aspect, including a mechanism reading a resistance change between the readout electrode layer and the magnetization free layer at the time of reading.

A thirteenth aspect of the present invention is a volatile logic circuit including a magnetic wall utilization analog memory on which the magnetic wall utilization spin MOSFET according to any one of the above-described first to tenth aspects, and an STT-MRAM, where the circuit has a memory function and a logical function, and as the memory function, includes the magnetic wall utilization analog memory and the STT-MRAM.

A fourteenth aspect of the present invention is a magnetic neuron element including the magnetic wall utilization spin MOSFET according to any one of the first to tenth aspects, where the third region of the magnetic wall driving layer includes a first memory portion, and a second memory portion and a third memory portion arranged so as to sandwich the first memory portion therebetween, which are arranged side-by-side in the longitudinal direction, and the magnetic neuron element includes a current source having a control circuit which is controllable of a flow of a write current capable of shifting magnetic walls sequentially such that the magnetic walls remain in all the memory portions of the first memory portion, the second memory portion, and the third memory portion at least once.

Effects of the Invention

According to the aspects of the present invention described above, it is possible to stably read multilevel recording data or analog recording data and amplify the output signal with one element.

EMBODIMENTS FOR CARRYING OUT THE INVENTION

Figure 1:
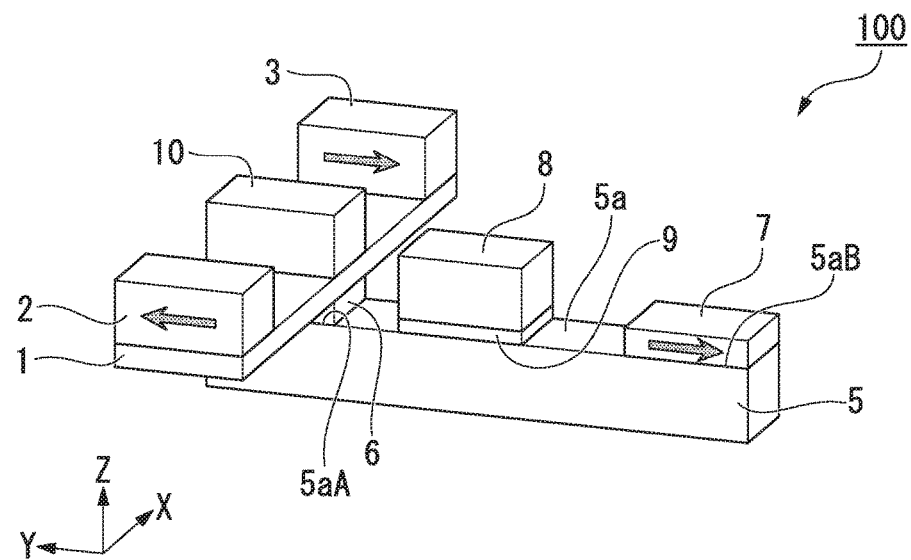
FIG. 1 is a perspective three-dimensional view schematically showing an example of a magnetic wall utilization spin MOSFET according to one embodiment of the present invention.

Hereinafter, the configuration of the magnetic wall utilization spin MOSFET and the magnetic wall utilization analog memory to which the present invention is applied will be described with reference to the drawings. In the drawings used in the following description, for the sake of easy understanding of the features, the characteristic portions are sometimes enlarged for convenience, and the dimensional ratios of the respective components are not always the same. In addition, the materials, dimensions, and the like exemplified in the following description are mere examples, and the present invention is not limited thereto, and it is possible to carry out the present invention by appropriately changing and modifying it within a range that achieves the effects of the present invention. In the element of the present invention, other layers may be provided as long as the effect of the present invention is achieved.

(Magnetic Wall Utilizing Spin MOSFET)

Figure 2:
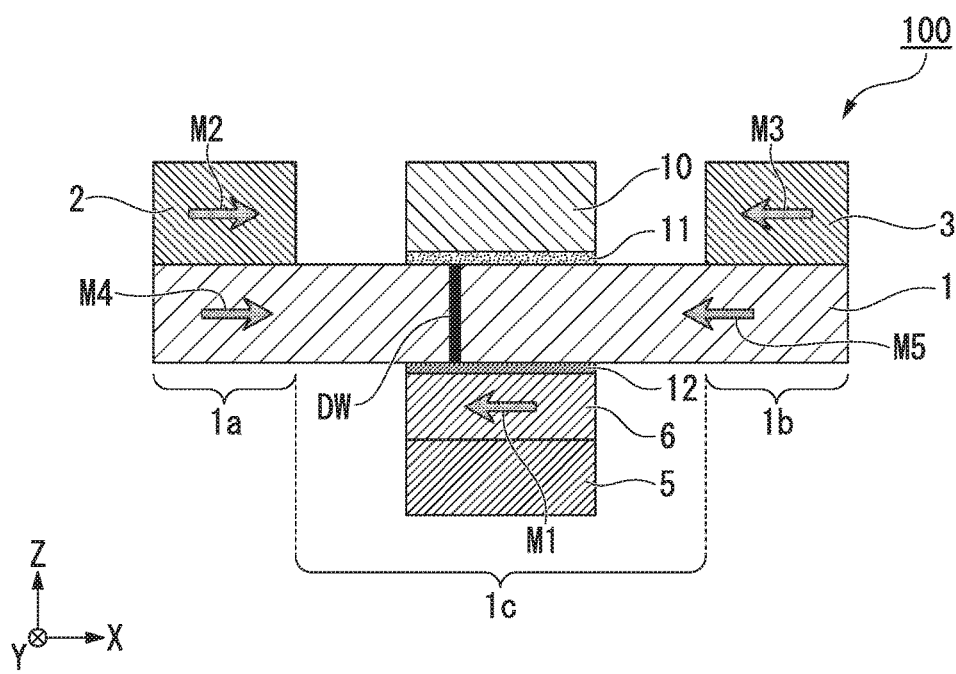
FIG. 2 is a schematic cross-sectional view of an example of a magnetic wall utilization spin MOSFET according to one embodiment of the present invention.

FIG. 1 is a three-dimensional perspective view schematically showing an example of a magnetic wall utilization spin MOSFET according to one embodiment of the present invention. FIG. 2 is a schematic cross-sectional view of the magnetic wall utilization spin MOSFET shown in FIG. 1 taken along the longitudinal center line of the magnetic wall driving layer.

The magnetic wall utilization spin MOSFET 100 shown in FIGS. 1 and 2 has a magnetic wall driving layer 1 having a magnetic wall DW and including a first region 1a, a second region 1b, and a third region 1c disposed therebetween. The magnetic wall utilization spin MOSFET 100 further includes a channel layer 5, a magnetization free layer 6 provided at a first end portion 5aA of one surface 5a of the channel layer 5, and a magnetization fixed layer 7 provided at a second end portion 5aB opposite to the first end portion, and a gate electrode 8 provided between the first end portion 5aA and the second end portion 5aB of the one surface 5a of the channel layer 5 via the gate insulating layer 9. The magnetization free layer is arranged so as to be in contact with the third region of the magnetic wall driving layer.

The magnetic wall utilization spin MOSFET 100 shown in FIG. 1 further includes a first magnetization supply layer 2 which is in contact with the first region 1a and has a first magnetization direction, and a second magnetization supply layer 3 which is in contact with the second region 1b and has a second magnetization direction opposite to the first magnetization direction.

The magnetic wall utilization spin MOSFET 100 shown in FIG. 1 further includes a readout electrode layer 10 arranged through the high resistance layer 11 so as to overlap with the magnetization free layer 6 in a plan view on the surface 6b opposite to the surface 6a where the magnetization free layer 6 is provided in the third region 1c of the magnetic wall driving layer 1. The high resistance layer 11 has higher electrical resistivity than the magnetic wall driving layer 1. The high resistance layer 11 is a layer preventing current from flowing into the readout electrode layer 10 when driving the magnetic wall of the magnetic wall driving layer 1 to inhibit the magnetic wall driving. The material of the high resistance layer 11 is not particularly limited as long as it is a material that performs the prevention function described above. It may be a nonmagnetic material. The high resistance layer 11 may be a tunnel barrier layer. Therefore, the high resistance layer 11 may be an insulating material that allows tunnel current to flow therethrough.

In addition, the magnetic wall utilization spin MOSFET 100 shown in FIG. 1 further includes a magnetic coupling layer 12 between the magnetization free layer 6 and the magnetic wall driving layer 1. The magnetic coupling layer 12 is a layer that magnetically couples the magnetization free layer 6 and the magnetic wall driving layer 1, and may be a magnetic material, or may be a nonmagnetic material for magnetically coupling a magnetic free layer 6 and a magnetic wall driving layer 1 by an RKKY interaction of Ru or the like.

In FIG. 2, the stacking direction of each layer, that is, the direction orthogonal to the main surface of each layer (perpendicular direction to the surface) is defined as the Z direction. Each layer is formed parallel to the XY plane orthogonal to the Z direction.

The magnetic wall driving layer 1 is a magnetization free layer formed of a ferromagnetic material, and the magnetization direction thereof can be reversed. The magnetic wall driving layer 1 has a magnetic wall, and by flowing current equal to or more than a threshold value in a direction (X direction) passing through the magnetic wall, by the spin polarized current generated in the domain (magnetic domain) of the magnetic wall driving layer 1, it is possible to shift the magnetic wall in the direction in which conduction electrons flow.

The first magnetization supply layer 2, the second magnetization supply layer 3, and the magnetization fixed layer 7 are layers (ferromagnetic layers) formed of a ferromagnetic material whose magnetization is fixed. The first magnetization supply layer 2 and the second magnetization supply layer 3 are arranged to face the magnetization free layer 6 with the magnetic wall driving layer 1 interposed therebetween. In addition, the first magnetization supply layer 2 and the second magnetization supply layer 3 are magnetically coupled to the magnetic wall driving layer 1. At the time of data writing, write current is flowed from one end to the other end of the magnetic wall driving layer 1.

In FIG. 2, the arrow M1, the arrow M2, and the arrow M3 indicate the magnetization direction of each layer, and the arrows M4 and M5 respectively indicate in the magnetic wall driving layer 1, the magnetization direction of a portion on the side of the first magnetization supply layer 2 with the magnetic wall DW as a boundary and the magnetization direction of a portion on the side of the second magnetization supply layer 3 with the magnetic wall DW as a boundary.

Figure 3:
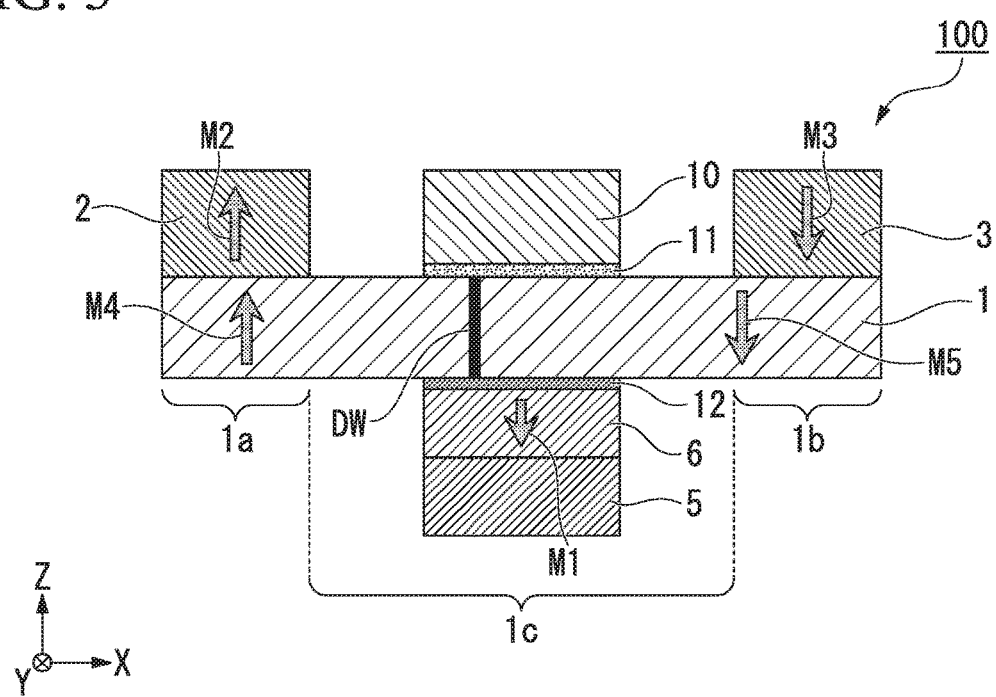
FIG. 3 is a schematic cross-sectional view of another example of a magnetic wall utilization spin MOSFET according to one embodiment of the present invention.

In the examples shown in FIGS. 1 and 2, the magnetic wall driving layer 1, the first magnetization supply layer 2, the second magnetization supply layer 3, the magnetization free layer 6, and the magnetization fixed layer 7 are magnetization films having in-plane magnetic anisotropy (axis of easy in-plane magnetization). However, as shown in FIG. 3, these layers may be perpendicular magnetization films having perpendicular magnetic anisotropy (axis of easy perpendicular magnetization). As a material which is easy to form an in-plane magnetization film, for example, NiFe is available. Further, as a film which easily forms a perpendicular magnetization film, for example, a Co/Ni laminated film is available.

When an in-plane magnetization film is used, an MR ratio is high and it is difficult to write by STT at the time of reading, so that large reading voltage can be used. On the other hand, when it is desired to miniaturize the element, it is preferable to use a perpendicular magnetization film having large magnetic anisotropy and small demagnetizing field. Since resistance to thermal disturbance is large, it is difficult to erase data.

Hereinafter, a conventional magnetic wall driving MRAM will be described.

The MRAM has a magnetoresistance effect element utilizing a magnetoresistive effect such as a GMR (Giant Magneto Resistance) effect and a TMR (Tunnel Magneto Resistance) effect as a memory cell. The magnetoresistance effect element has, for example, a laminated structure in which two ferromagnetic layers are laminated via a nonmagnetic layer. The two ferromagnetic layers are a magnetization fixed layer (pinned layer) in which the magnetization direction is fixed and a magnetization free layer (free layer) in which the magnetization direction can be reversed. The value of the electric resistance of the magnetoresistance effect element is larger when the magnetization directions of the magnetization fixed layer and the magnetization free layer are antiparallel than when the magnetization direction is parallel to each other. In the magnetoresistance effect element which is the memory cell of the MRAM, by utilizing the difference in the value of the electric resistance, by associating the parallel state of magnetization with data "0" and the antiparallel state with data "1", the data is stored in a nonvolatile manner. Reading of data is performed by causing read current to flow through the magnetoresistance effect element (passing through the laminated structure) and measuring the resistance value of the magnetoresistance effect element. On the other hand, data writing is performed by flowing a spin polarized current to invert the magnetization direction of the magnetization free layer.

As the mainstream current data writing method, an "STT method" utilizing spin transfer torque is known. In the STT method, spin polarized current is injected into the magnetization free layer, and torque is generated in the magnetization free layer by the interaction between the spin of conduction electrons responsible for the spin polarized current and the magnetic moment of the magnetization free layer. When the torque is sufficiently large, the magnetization is reversed. Since the magnetization inversion tends to occur as the current density is larger, the write current can be reduced as the size of the memory cell is reduced.

In addition, as the STT method, there has been known a method in which write current flows so as to pass through a magnetoresistive effect element (for example, Patent Document 1) and a method in which write current flows in the in-plane direction of the magnetization free layer without passing through the magnetoresistive effect element (for example, Patent Document 4).

According to the former method, spin-polarized electrons having the same spin state as the magnetization fixed layer are supplied from the magnetization fixed layer to the magnetization free layer, or are extracted from the magnetization free layer to the magnetization fixed layer. As a result, the magnetization of the magnetization free layer is reversed by the spin transfer effect. As described above, the magnetization direction of the magnetization free layer can be defined by the direction of the write current passing through the magnetoresistance effect element. A magnetic wall driving magnetic memory including a plurality of magnetoresistance effect elements described above is called magnetic wall driving MRAM.

On the other hand, the latter method will be described with reference to FIG. 4. FIG. 4 is a schematic cross-sectional view showing an example of a conventional magnetic wall driving magnetoresistance effect element. In FIG. 4, the positions of the first magnetization supply layer and the second magnetization supply layer with respect to the magnetic wall driving layer are inverted upside-down as compared with FIGS. 1 to 3; however, there is no technical difference.

In the conventional magnetic wall driving magnetoresistance effect element shown in FIG. 4, data writing is performed by shifting the magnetic wall DW formed in the magnetic wall driving layer 1.

In FIG. 4, layers having the same reference numerals as those in FIGS. 1 to 3 are layers having the same function. Reference numeral 15 denotes a ferromagnetic layer which is provided on the third region of the magnetic wall driving layer 1 with the nonmagnetic layer 16 interposed therebetween, and a magnetoresistive effect element formed of the ferromagnetic layer 15, the nonmagnetic layer 16, and the third magnetic wall driving layer 1 (hereinafter sometimes referred to as "magnetoresistive effect element portion") is formed.

The magnetic wall driving layer 1 has a first region 1a and a second region 1b whose magnetizations are fixed substantially antiparallel to each other and a third region 1c located between the first region 1a and the second region 1b. The magnetization of the third region 1c is substantially parallel to either the first region 1a or the second region 1b. Due to this restriction of the magnetization state, the magnetic wall is introduced into the magnetic wall driving layer 1. The magnetic wall can be shifted by flowing spin polarized current in the magnetic wall driving layer 1.

Figure 4A:
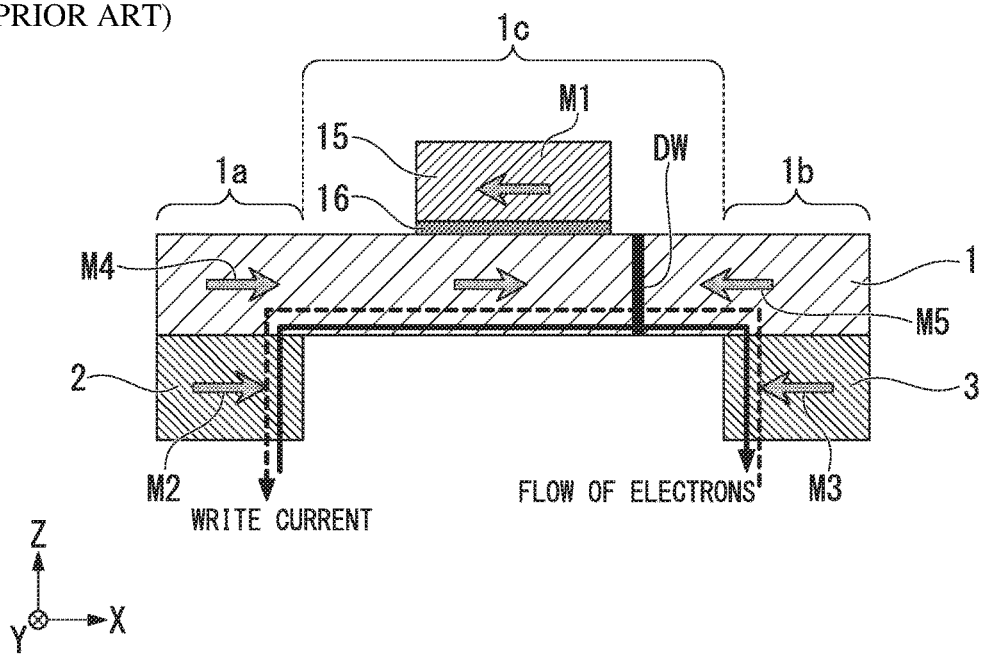
FIG. 4A is a schematic cross-sectional view describing a method of shifting a magnetic wall in a conventional magnetic wall driving magnetoresistive effect element.
Figure 4B:
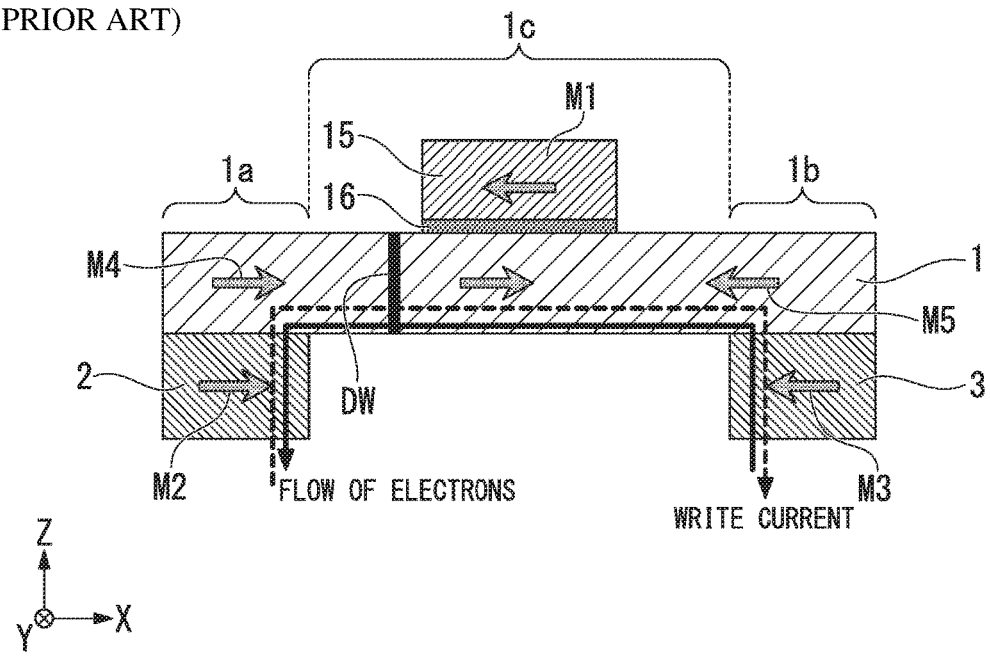
FIG. 4B is a schematic cross-sectional view describing a method of shifting a magnetic wall that shifts a magnetic wall in a direction opposite to that of FIG. 4A.

For example, when current is caused to flow from the second magnetization supply layer 3 to the magnetic wall driving layer 1 and further to the first magnetization supply layer 2 in the direction indicated by the dotted line in FIG. 4A, the conduction electrons flows in the direction indicated by solid lines opposite to the direction of the flow of the current. When the electrons enter the magnetic wall driving layer 1 from the first magnetization supply layer 2, the electrons become spin-polarized electrons, which correspond to the magnetization direction of the domain magnetically coupled to the first magnetization supply layer 2 and the first magnetization supply layer 2 of the magnetic wall driving layer 1. When the spin-polarized electrons reach the magnetic wall, the spin of the spin-polarized electrons in the magnetic wall causes spin transfer with respect to the magnetic wall, and the magnetic wall shifts in the same direction as the flowing direction of the conduction electrons. Likewise, when current is caused to flow from the first magnetization supply layer 2 to the magnetic wall driving layer 1 and further to the second magnetization supply layer 3 in the direction indicated by the dotted line in FIG. 4B, the conduction electrons flows in the direction shown in a solid line opposite to the direction of the flow of the current. When electrons enter the magnetic wall driving layer 1 from the second magnetization supplying layer 3, the electrons become spin-polarized electrons, which correspond to the magnetization direction of the domain magnetically coupled to the second magnetization supply layer 3 and the second magnetization supply layer 3 of the magnetic wall driving layer 1.

When the spin-polarized electrons reach the magnetic wall, the spin of the spin-polarized electrons in the magnetic wall causes spin transfer with respect to the magnetic wall, and the magnetic wall shifts in the same direction as the flowing direction of the conduction electrons.

By the shift of the magnetic wall as described above, the magnetization of the portion of the magnetic wall driving layer 1 just under the ferromagnetic layer 15 can be set in a state parallel or antiparallel to the magnetization direction of the ferromagnetic layer 15. Therefore, information can be rewritten between the "0" state and the "1" state.

In the MRAM using the conventional magnetic wall driving magnetoresistance effect element, the data write current does not pass through the magnetoresistance effect element portion but flows in the in-plane direction (direction parallel to the stacking direction) of the magnetic wall driving layer (see FIG. 4).

In reading data, current is caused to flow between the ferromagnetic layer 15 and the magnetic wall driving layer 1 via the nonmagnetic layer 16, and a change of resistance corresponding to the relative angle between the magnetization of the ferromagnetic layer 15 and the magnetization of the magnetic wall driving layer 1 is detected. When the magnetization of the portion of the magnetic wall driving layer 1 directly below the ferromagnetic layer 15 is parallel to the magnetization direction of the ferromagnetic layer 15, the resistance is low, whereas when it is antiparallel, the resistance is high, and by detecting such a change of resistance, the data is identified.

Figure 5:
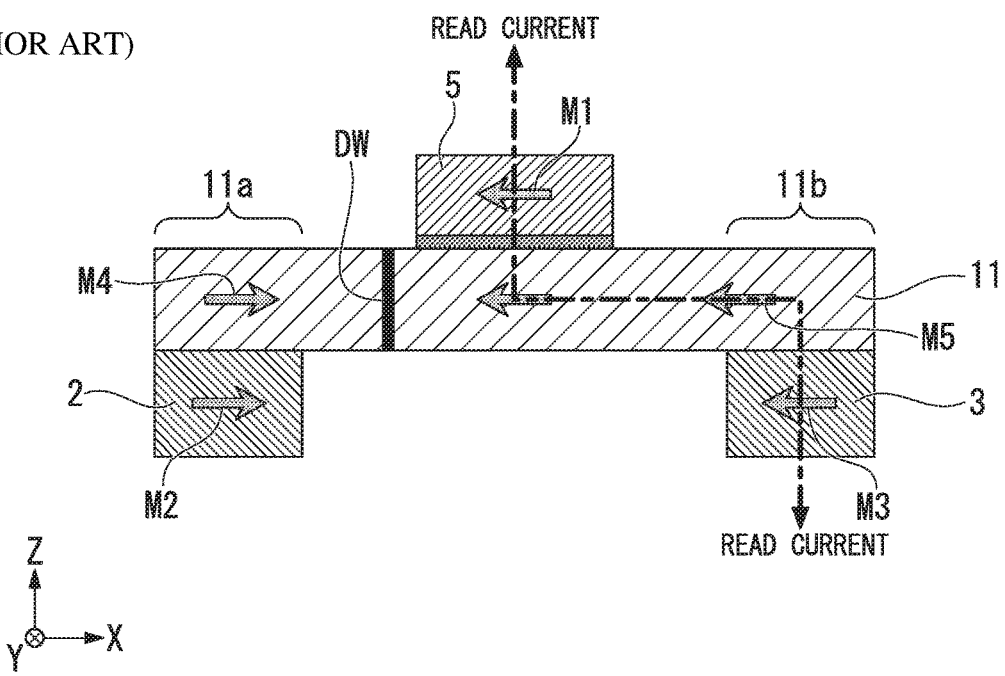
FIG. 5 is a schematic cross-sectional view describing a path through which read current flows in a conventional magnetic wall driving magnetoresistance effect element.

In the conventional MRAM using the magnetic wall driving magnetoresistive effect element, the data write current does not pass through the magneto-resistive effect element (in FIG. 3, the laminate structure including the magnetization fixed layer 5 and the magnetic wall driving layer 1 via the nonmagnetic layer 6) and flows to the in-plane direction (direction parallel to stacking direction) of the magnetic wall driving layer (see FIG. 4). On the other hand, the data reading current passes through the magnetoresistance effect element (the laminated structure composed of the magnetization fixed layer 5 and the magnetic wall driving layer 1 with the nonmagnetic layer 6 interposed therebetween) as shown by the alternate long and short dash line in FIG. 5, and then flows through a portion of the path through which the write current flows (see, for example, Patent Document 6). That is, the path of the read current partially overlaps the path of the write current. In this case, it is necessary to flow a current in the direction of magnetic wall driving (in-plane direction) of the magnetic wall driving layer at the time of reading. Therefore, the output signal obtained finally becomes a digital signal of 0 or 1. In addition, if the magnetic wall shift is not completed outside the portion where the magnetic wall driving layer and the magnetoresistance effect element portion overlap in a plan view, the magnetic wall shifts at the time of reading, and the erroneous writing and the signal change at the initial stage of reading may occur.

Figure 6A:
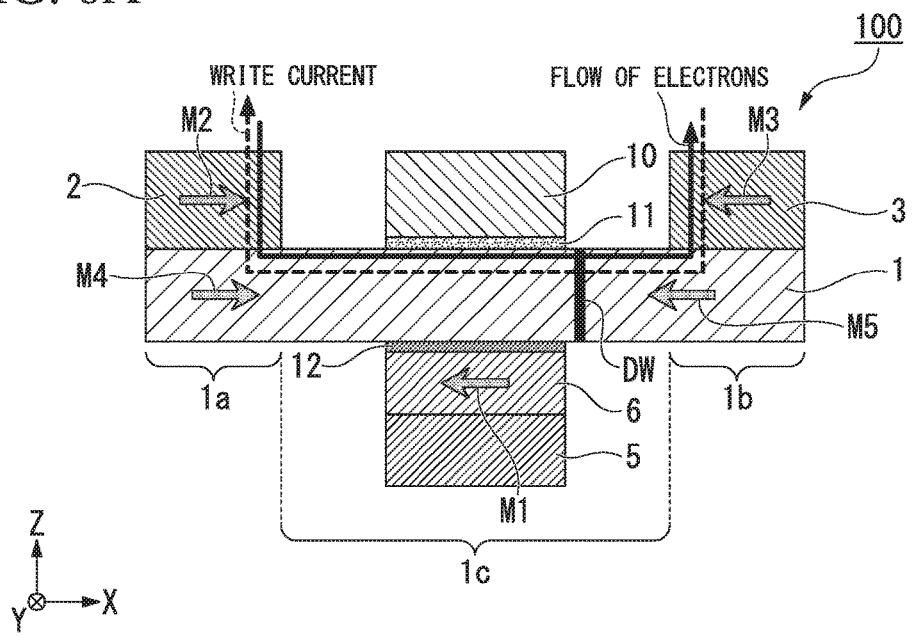
FIG. 6A is a schematic cross-sectional view showing a current flow in a cross section taken along a longitudinal center line of a magnetic wall driving spin MOSFET shown in FIG. 2.
Figure 6B:
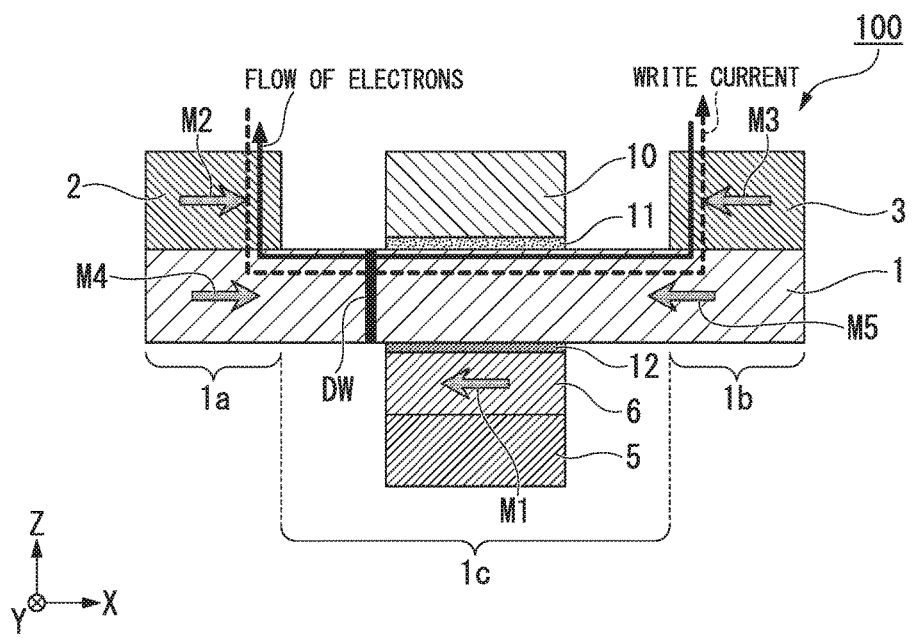
FIG. 6B is a schematic cross-sectional view showing a current flow opposite to that of FIG. 6A.

FIGS. 6A and 6B are diagrams showing the flow of electric current in a schematic cross-sectional view in which the magnetic wall utilization spin MOSFET of the present embodiment shown in FIG. 2 is taken along the longitudinal center line of the magnetic wall driving layer. Also in the magnetic wall utilization spin MOSFET of the present embodiment, the data write current does not pass through the magnetoresistance effect element portion and can flow in the in-plane direction (direction parallel to the stacking direction) of the magnetic wall driving layer, which is similar to the conventional magnetic wall driving-magnetoresistive effect element.

Figure 7:
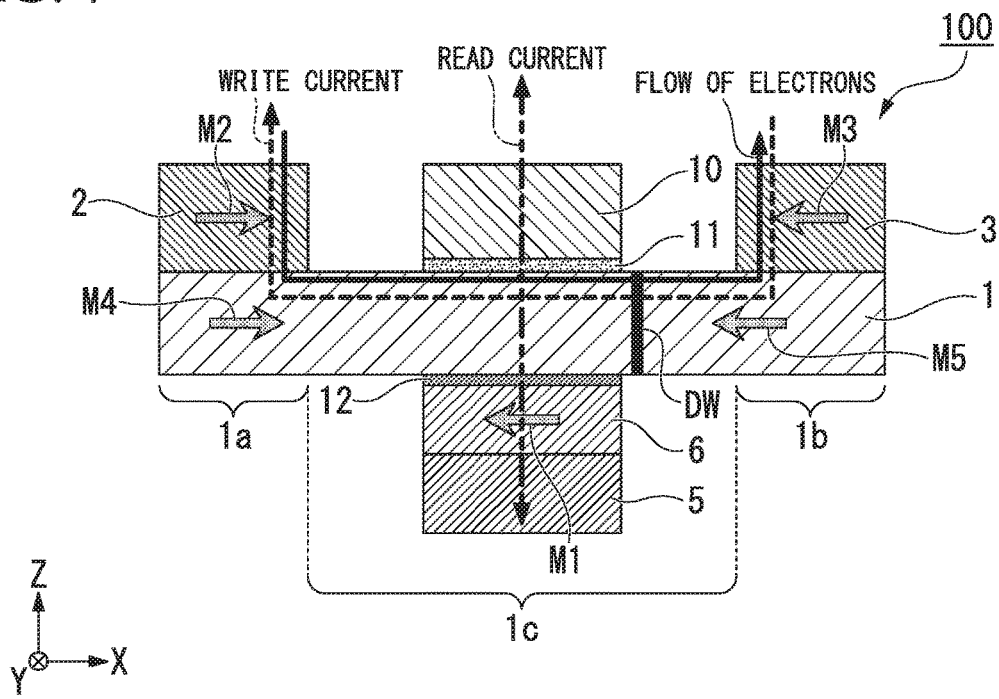
FIG. 7 is a schematic cross-sectional view describing a path through which read current flows in the magnetic wall utilization spin MOSFET of the present invention.

On the other hand, the path of the read current is different. That is, in the magnetic wall utilization spin MOSFET according to the present embodiment, on the surface 6b opposite to the surface 6a provided with the magnetization free layer 6 in the third region 1c of the magnetic wall driving layer 1, the readout electrode layer 10 is provided at a position overlaps with the magnetization free layer 6 in a plan view, the readout current flows in a direction perpendicular to the surface of the magnetic wall driving layer 1 as indicated by a two-dot chain line in FIG. 7. Therefore, since the read current does not flow in the magnetic wall driving direction (in-plane direction) of the magnetic wall driving layer, the shift of the magnetic wall at the time of reading can be reduced and the distance of the magnetic wall driving layer through which the read current flows is short, magnetic noise can be reduced.

Figure 8:
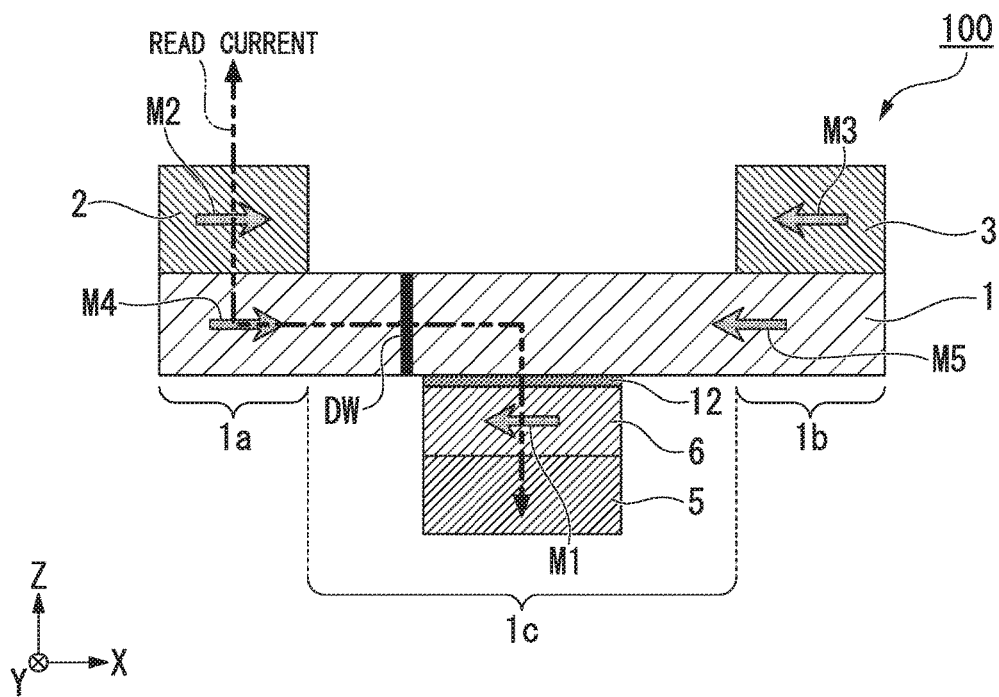
FIG. 8 is a schematic cross-sectional view describing a path through which read current flows in a magnetic wall utilization spin MOSFET according to another embodiment of the present invention.

The magnetic wall shifts when current exceeding the threshold flows. Therefore, as shown in FIG. 8, by adjusting the conditions of the read current, even when the read electrode layer is not provided, it is possible to read out the data in which the shift of the magnetic wall at the time of reading and to read out the data with suppression of magnetic noise.

Figure 9:
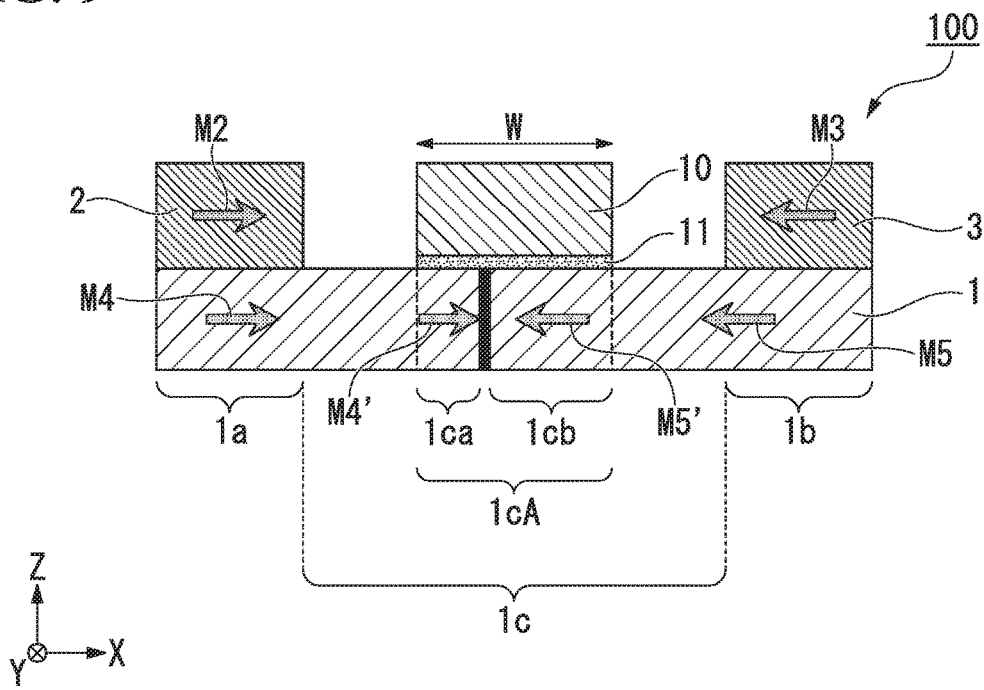
FIG. 9 is a cross-sectional schematic view describing the principle of writing and reading of the magnetic wall utilization spin MOSFET of the present invention.

FIG. 9 is a schematic cross-sectional view showing a case where the magnetic wall DW is positioned in a portion 1cA between the magnetization free layer 6 and the readout electrode layer 10 in a plan view. The channel layer 5, the magnetization free layer 6 and the magnetic coupling layer 12 are not shown.

The magnetic wall DW can be shifted by causing a write current (spin polarized current) to flow in the in-plane direction of the magnetic wall driving layer 1.

The shift direction of the magnetic wall DW can be set depending on the direction in which the write current flows. That is, when it is desired to shift the magnetic wall DW in the −X direction, a write current (spin polarized current) is caused to flow in the X direction so that the flow of the spin-polarized electrons strikes from the right side of the magnetic wall DW (see FIG. 4B). Conversely, when it is desired to shift the magnetic wall DW in the X direction, a write current (spin polarized current) is caused to flow in the −X direction so that the flow of the spin-polarized electrons strikes from the left side of the magnetic wall DW (see FIG. 4A).

In addition, the amount of shift (shift distance) of the magnetic wall DW can be variably controlled by adjusting the magnitude and time of the write current. The magnitude and time of the write current may be set, for example, by the number of pulses or the pulse width.

As described above, the position of the magnetic wall DW in the magnetic wall driving layer 1 can be shifted to a desired position by adjusting the direction, magnitude, time, pulse number or pulse width of the write current (spin polarized current) to flow.

[The current flows between the magnetization free layer 6 and the magnetization fixed layer 7 via the channel layer 5, whereby a magnetoresistance effect element (hereinafter, may be referred to as "magnetoresistance effect element portion") is formed. In the magnetoresistance effect element portion, the resistance value varies depending on the position of the magnetic wall DW. Further, by applying a voltage to the gate electrode, the resistance between the magnetization free layer 6 and the magnetization fixed layer 7 is changed, and the magnetic wall utilization spin MOSFET in which the magnetoresistive output also changes is formed.

When the magnetic wall DW is at the position shown in FIG. 9, the magnetoresistance effect element portion includes a parallel circuit which includes a low resistance portion which is formed by the magnetization free layer 6, the magnetic coupling layer 12, and a portion 1cb which is at the side of the second magnetization supply layer 3 from the magnetic wall DW of the magnetic wall driving layer 1 (a portion whose magnetization direction is parallel to the magnetization direction of the magnetization fixed layer 7), and a high resistance portion which is formed by the magnetization free layer 6, the magnetic coupling layer 12, and a portion 1ca which is at the side of the first magnetization supply layer 2 from the magnetic wall DW of the magnetic wall driving layer 1 (a portion whose magnetization direction is antiparallel to the magnetization direction of the magnetization fixed layer 7).

With the above configuration, an analog resistance value can be output as the resistance value of the magnetoresistance effect element portion. By setting the position of the magnetic wall DW at a plurality of positions, it is possible to output multivalued resistance values according to the number of the positions.]

Figure 10:
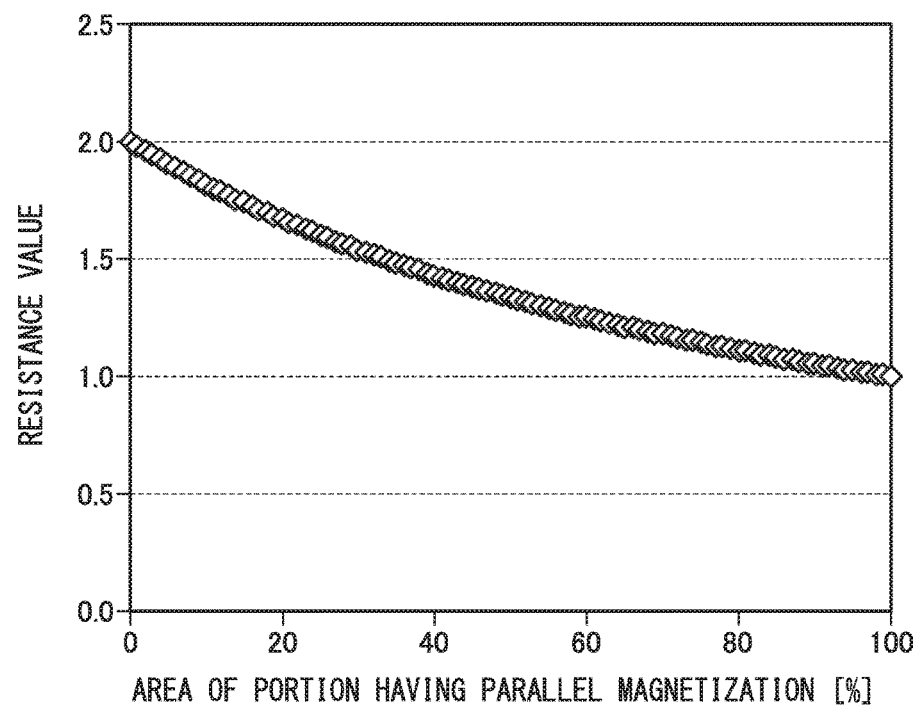
FIG. 10 is a graph conceptually showing a relationship between the proportion of the area of the portion parallel to the magnetization direction of the magnetization fixed layer and the resistance value of the magnetoresistance effect element portion.

FIG. 10 is a graph conceptually showing the relationship between the ratio of the area of the portion 1cb (corresponding to the position of the magnetic wall DW) parallel to the magnetization direction of the magnetization free layer 6 and the resistance value of the magnetoresistance effect element portion.

Conventionally, there has been a method of setting a multi-valued resistance value or an analog resistance value by shifting the position of the magnetic wall in the magnetic wall driving layer to a desired position; however, there is no method to stably read out the values.

In the magnetic wall utilization spin MOSFET of the present embodiment, by employing a structure in which the readout electrode layer 10 is provided at a position overlapping with the magnetization free layer 6 in plan view, it is possible to flow the read current in the vertical direction of the magnetic wall driving layer. That is, by flowing read current (flow of spin-polarized electrons) in a direction parallel to the magnetic wall, it is possible to dramatically reduce the influence on the magnetic wall at the time of reading, as compared with the conventional technique. As a result, stable reading can be performed as compared with the prior art.

As the material of the magnetic wall driving layer 1, a known material that can be used for the magnetization free layer can be used. Particularly, soft magnetic materials can be applied. For example, metals selected from the group consisting of Cr, Mn, Co, Fe and Ni, alloys containing at least one of these metals, and alloys including these metals and at least one element of B, C, and N or the like can be used. Specifically, Co—Fe, Co—Fe—B, and Ni—Fe can be mentioned.

It is preferable that the length of the magnetic wall driving layer 1, that is, the combined length of the first region, the second region, and the third region located between the first and second regions, is preferably 60 nm or more. Usually, when it is less than 60 nm, it tends to be a single magnetic domain and it has no magnetic wall in some cases.

The thickness of the magnetic wall driving layer 1 is not particularly limited as long as it functions as a magnetic wall driving layer; however, it can be 2 to 60 nm, for example. When the thickness of the magnetic wall driving layer 1 is 60 nm or more, magnetic walls may be formed in the stacking direction. However, whether or not the magnetic wall can be formed in the stacking direction is caused by the balance with the shape anisotropy of the magnetic wall driving layer; therefore, it is not limited that the thickness of the magnetic wall driving layer 1 is less than 60 nm.

The magnetic wall driving layer 1 may have a magnetic wall trap portion for stopping the shift of the magnetic wall on the side face of the layer. As a specific configuration of the magnetic wall trap portion, a well-known structure, for example, irregularities, grooves, bulges, constricted portions, notches, or the like can be used. By providing such a magnetic wall trap portion, the magnetic wall can be stopped (pinned), and unless current equal to or larger than the threshold value is passed, the magnetic wall cannot be shifted any more. With the above configuration, the output signal can be multi-leveled instead of analog.

For example, by forming the magnetic wall trap portion at predetermined distances, it is possible to more stably hold the magnetic wall, to enable stable multilevel recording, and to read out the multilevel output signal more stably.

Figure 14:
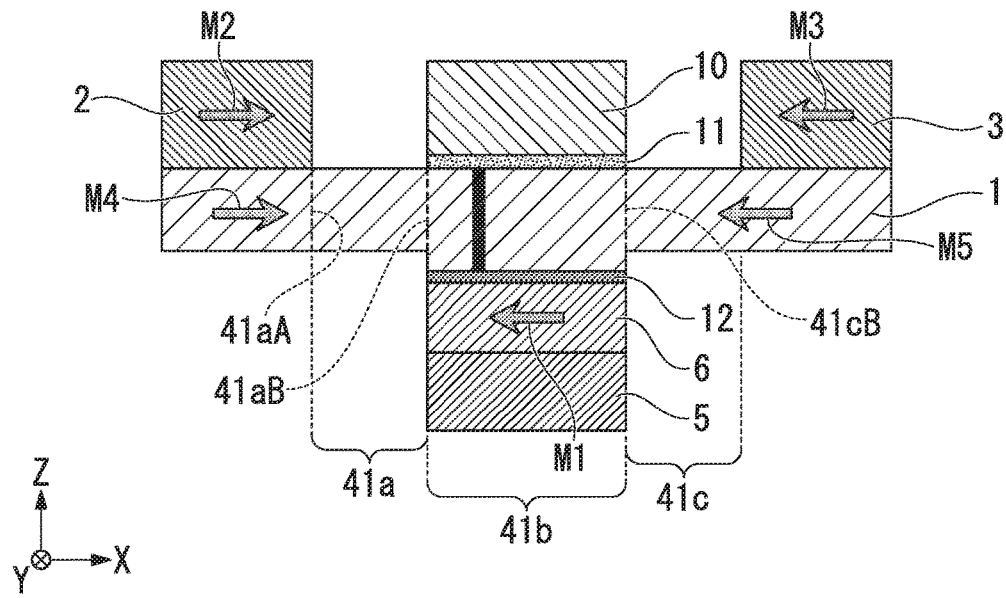
FIG. 14 is a schematic cross-sectional view of an example of a magnetic neuron element according to an embodiment of the present invention.

The thickness of the portion of the magnetic wall driving layer 1 which overlaps with the magnetization free layer 6 in a plan view may be thicker than the other portions (see FIG. 14). As the magnetic wall transfers over the portion overlapping with the magnetization free layer 6, the cross-sectional area of the magnetic wall increases, so the current density decreases and the drive speed of the magnetic wall slows down. This makes it easy to control the analog value of the output. In addition, in the case of forming such a structure, it is possible to form the magnetic wall driving layer 1, the magnetic coupling layer 12, and the magnetization free layer 6 by continuous film formation and scraping unnecessary portions. When the continuous film formation is performed, the bonds between the layers to be joined are strengthened, and the magnetic coupling and the output with higher efficiency can be obtained.

For the material of the magnetization free layer 6, a known ferromagnetic material that can be used for the magnetization free layer can be used. For example, metals selected from the group consisting of Cr, Mn, Co, Fe and Ni, alloys containing at least one of these metals, and alloys including these metals and at least one element of B, C, and N or the like can be used. Specifically, Co—Fe, Co—Fe—B, and Ni—Fe can be mentioned.

When the magnetization direction of the magnetization free layer 6 is made perpendicular to the laminated surface, the sum of the thickness of the magnetization free layer 6 and the thickness of the magnetic wall driving layer 1 is preferably 2.5 nm or less. It is possible to add perpendicular magnetic anisotropy to the magnetization free layer 6 at the interface between the magnetization free layer 6 and the magnetic coupling layer 12. Since the effect of the perpendicular magnetic anisotropy decreases by increasing the sum of the thicknesses of the magnetization free layer 6 and the magnetic wall driving layer 1, the sum of the film thickness of the magnetization free layer 6 and the film thickness of the magnetic wall driving layer 1 is preferably thin.

As a material of the magnetic coupling layer 12, a known nonmagnetic material can be used.

In the case of Ru, the coupling force between the magnetization free layer 6 and the magnetic wall driving layer 1 can be changed depending on the film thickness. For example, in the case of 0.4 nm, antiferromagnetic coupling can be strengthened.

In addition, a ferromagnetic material can also be used for the magnetic coupling layer 12.

A tunnel barrier layer may be provided between the magnetization free layer 6 and the channel layer 5 and/or the magnetization fixed layer 7 and the channel layer 5. By providing the tunnel barrier layer, it is possible to suppress the effect of the injected spin returning to the injected electrode and to obtain a larger output voltage.

As a material of the tunnel barrier layer, a known insulating material that can be used for the tunnel barrier layer can be used. For example, $Al_2O_3$, $SiO_2$, MgO, $MgAl_2O_4$, $ZnAl_2O_4$, $MgGa_2O_4$, $ZnGa_2O_4$, $MgIn_2O_4$, and $ZnIn_2O_4$, and multilayer films or mixed composition films of these materials can be used. In addition to these materials, a material in which a portion of Al, Si, Mg is substituted with Zn, Be or the like can also be used. Among them, since MgO and MgAl$_2$O$_4$ are materials that can realize coherent tunneling, the spin can be efficiently injected.

As a material of the channel layer 5, a semiconductor such as Si or Ge, or a compound semiconductor such as GaAs or InGaAs can be used. The shortest distance between the source electrode 2S and the drain electrode 2D in the channel layer 5, that is, the channel length (d) is preferably 0.1 µm or more and 100 µm or less. The channel length (d) is set shorter than the spin diffusion length in the channel layer 5. For example, the material of the channel layer 5 is Si, the channel length (d) is 3 µm, and the resistivity of the channel layer 5 is 1 Ω·cm. The conductivity type of the channel layer 5 is an N-type; however, a P-type can also be used.

The channel layer 5 may be a layer formed on a substrate or the like; however, may itself be a substrate.

The shape of the readout electrode layer 10 is preferably the same size as the magnetization free layer 6 in plan view so as not to generate a horizontal component of a reading current (spin polarized current) leading to shift of the magnetic wall. However, even if it is not the same size, it exhibits its effect as compared with the conventional magnetic wall driving magnetoresistive effect element. For example, in plan view, the overlapping degree between the readout electrode layer and the magnetization free layer 6 is preferably 50% or more, more preferably 90% or more, and further preferably 100%.

For example, if the overlapping degree between the readout electrode layer 10 and the magnetization free layer 6 is other than 100%, the magnetic wall may shift during reading. Whether or not the magnetic wall shifts during readout depends on the overlapping position of the readout electrode layer 10 and the magnetization free layer 6 and the direction of the readout current.

As the material of the readout electrode layer 10, a known material used as an electrode material can be used. For example, aluminum, silver, copper, gold, or the like can be used.

When the high resistance layer 11 is an insulating material, the thickness of the high resistance layer 11 is preferably set to 0.8 nm or more so that the write current does not flow into the readout electrode layer 10. On the other hand, from the viewpoint that the write current does not flow into the readout electrode layer 10 and the influence in the read operation is almost negligible, it is preferable to set the thickness to 2 nm or less.

As a material of the high resistance layer 11, if a layer is capable of suppressing (substantially preventing) the current for driving the magnetic wall to the lower electrode layer 4 when driving the magnetic wall of the magnetic wall driving layer 1, there is no particular limitation. The high resistance layer 11 may be a tunnel barrier layer or a known insulating material that can be used for the tunnel barrier layer may be used. For example, Al$_2$O$_3$, SiO$_2$, MgO, MgAl$_2$O$_4$ or the like can be used. In addition to these materials, a material in which a portion of Al, Si, Mg is substituted with Zn, Be or the like can also be used. The material of the high resistance layer 11 functions if the resistivity is at least higher than that of the magnetic wall driving layer 1. For example, a semiconductor such as Si, SiGe or Ge, or a metal such as bismuth or nichrome may be used.

The distance between the end portion in the X direction of the magnetization free layer 6 and the end portion in the X direction of the first magnetization supply layer 2 and the second magnetization supply layer 3 can be arbitrarily designed. The magnetic wall in the magnetic wall driving layer 1 has the end portion close to the magnetization free layer 6 in contact with the first magnetization supply layer 2 and the second magnetization supply layer 3 to be the maximum movable range. The first magnetization supply layer 2 and the second magnetization supply layer 3 are magnetically coupled to the magnetic wall driving layer 1 and even if the magnetic wall driving operation is performed, when the energization in the magnetic wall driving layer 1 is stopped, the magnetic wall can be stabilized at the end portion thereof. In addition, the readout output is not affected until the magnetic wall shifts from the end portion to the end of the magnetization free layer 6.

Figure 11:
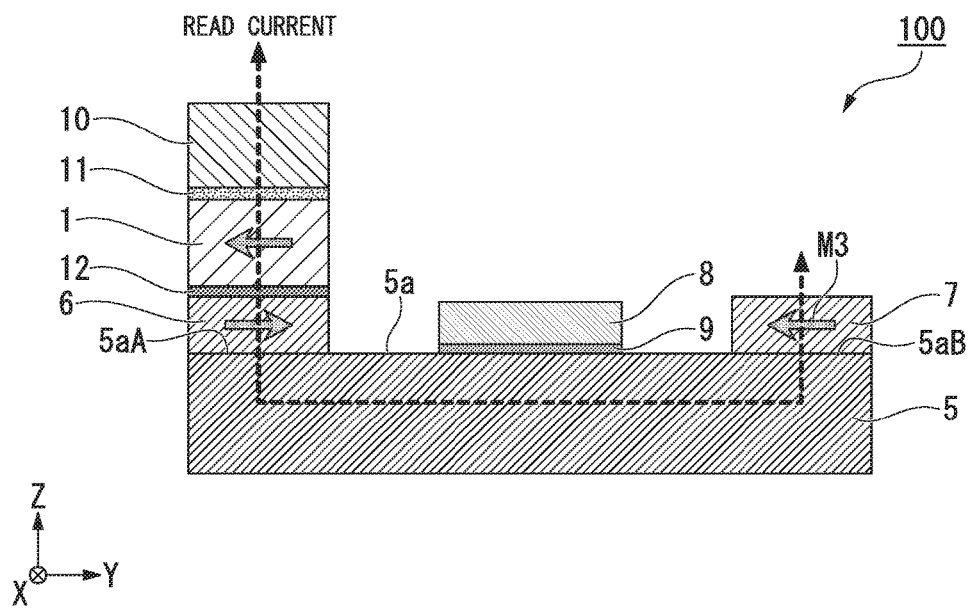
FIG. 11 is a schematic cross-sectional view of the magnetic wall utilization spin MOSFET shown in FIG. 1 taken along the longitudinal center line of the channel layer.

FIG. 11 is a schematic cross-sectional view of the magnetic wall utilization spin MOSFET shown in FIG. 1 taken along the longitudinal center line of the channel layer. The magnetization fixed layer 7 is a layer in which the magnetization direction does not change before and after writing using a write current and the magnetization free layer 6 is a layer in which the magnetization direction can change before and after writing using a write current. The magnetization fixed layer 7 and the magnetization free layer 6 are provided at the first end portion 5aA and the second end portion 5aB of the one surface 5a of the channel layer 5, and between the first end portion 5aA and the second end portion 5aB, a gate electrode 8 is provided with a gate insulating layer 9 interposed therebetween.

The magnetization fixed layer 7 may have a synthetic structure composed of an antiferromagnetic layer, a ferromagnetic layer, and a nonmagnetic layer. In the synthetic structure, the magnetization direction is strongly held by the antiferromagnetic layer, so it can be made to function as a fixed magnetization layer hardly affected from the outside.

By using the magnetization fixed layer 7 and the magnetization free layer 6 as the source electrode or the drain electrode, the structure of the MOSFET is provided and the source electrode and the drain electrode is the magnetization fixed layer and the magnetization free layer, whereby the ordinary spin MOSFET is structured. Since the source electrode and the drain electrode are ferromagnetic materials, the current spin-polarized from the ferromagnetic material to the channel layer is injected. Ordinary MOSFET controls the current by the gate voltage; however, in the spin MOSFET, in addition to the gate voltage, a method controlling such as an external magnetic field is newly added. That is, the output current due to the magnetoresistive effect varies depending on the relative angle of the magnetization directions of the source electrode and the drain electrode.

By changing the magnetization direction of the magnetization free layer 6, the magnetizations of the magnetization fixed layer 7 and the magnetization free layer 6 are substantially parallel or substantially antiparallel. Data can be stored according to the magnetization direction of the magnetization free layer 6 and can also be used as an ordinary spin MOSFET. That is, if the magnetization direction of the drain electrode made of ferromagnetic material is made to correspond to the digital value of data "0" and data "1", the amount of carriers taken out from the drain electrode changes depending on the magnetization direction.

Regarding the magnetization direction, by a method of passing a spin polarized current between the magnetization fixed layer 7 and the magnetization free layer 6 or by externally controlling the direction, it is also possible to use the magnetization fixed layer 7, the magnetization free layer 6, the channel layer 5, and a portion of the conventional spin MOSFET as a memory element.

In FIG. 11, the read current flows in the path indicated by the dotted line; however, the resistance of the current flowing through the path is determined by the resistance between the magnetization fixed layer 7 and the magnetization free layer 6 and the resistance between the magnetization free layer 6 and the magnetic wall driving layer 1 (the portion of numeral reference 1cA in FIG. 9). That is, in the magnetic wall utilization spin MOSFET of the present embodiment, the magnetoresistive effect of the two stages can be utilized: the magnetoresistive effect between the magnetization fixed layer 7 and the magnetization free layer 6, and the magnetoresistive effect between the magnetization free layer 6 and the magnetic wall driving layer 1 (portion of the reference numeral 1cA in FIG. 9). Therefore, there is a possibility that the magnetic wall utilization spin MOSFET of the present embodiment can be used with a different concept from the conventional spin MOSFET or the magnetic wall driving MRAM.

(Magnetic Wall Utilizing Analog Memory)

The magnetic wall utilization analog memory of the present embodiment includes a plurality of magnetic wall utilization spin MOSFETs of the present embodiment.

Figure 12:
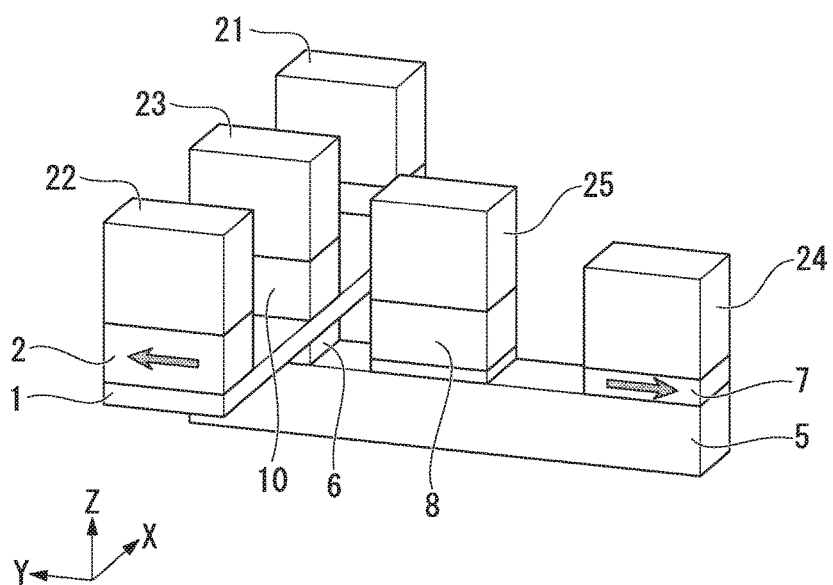
FIG. 12 is a sectional view taken along a longitudinal center line of a magnetic wall driving layer of a main portion of a cell in a magnetic wall utilization analog memory.

FIG. 12 is a schematic cross-sectional view taken along the longitudinal center line of the magnetic wall driving layer of the main portion of the cell in the magnetic wall utilization analog memory.

In the magnetic wall utilization spin MOSFET 100 shown in FIG. 1 and the like, the first wiring 21 and the second wiring 22 are connected to the first magnetization supply layer 2 and the second magnetization supply layer 3, respectively. In addition, the third wiring 23 is connected to the read electrode layer 10, the magnetization fixed layer 7 is connected to the fourth wiring 24, and the gate electrode 8 is connected to the fifth wiring 25.

As the first wiring 21, the second wiring 22, the third wiring 23, the fourth wiring 24, and the fifth wiring 25, a material used as a material of an ordinary wiring can be used. For example, aluminum, silver, copper, gold, or the like can be used.

Figure 13:
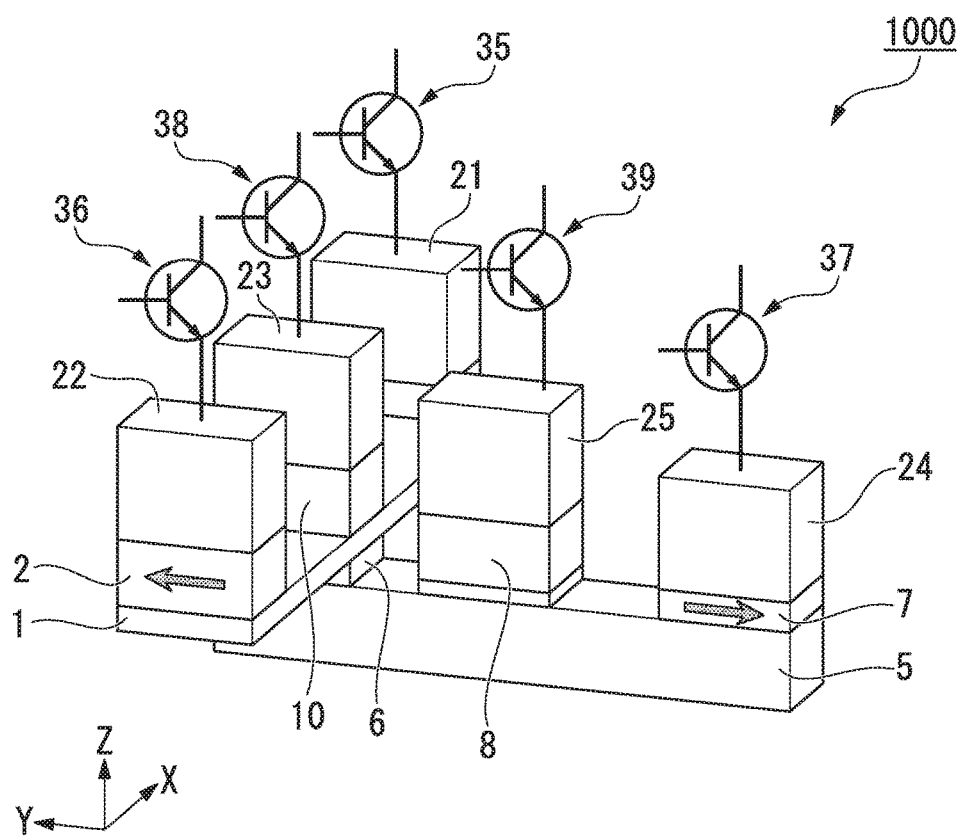
FIG. 13 is a diagram schematically showing an example of a circuit structure of a magnetic wall utilization analog memory of the present invention.

FIG. 13 is a diagram schematically showing an example of a circuit structure of the magnetic wall utilization analog memory 1000 according to one embodiment of the present embodiment. FIG. 13 shows a portion connected to one cell.

The first control element 35 is connected to the magnetic wall driving layer 1 via the second wiring 21 and the second magnetization supply layer 3 (only the second wiring 21 and the second magnetization supply layer 3 of one cell are shown) of each of the plurality of magnetic wall utilization spin MOSFETs 100. The first control element 35 is connected to all the magnetic wall utilization spin MOSFETs 100. In addition, the first control element 35 is connected to an external power source which is not shown, and controls the current flowing through the magnetic wall driving layer 1.

The first cell selection element 36 is connected to the magnetic wall driving layer 1 via the first wiring 22 and the first magnetization supply layer 2 (only the first wiring 22 and the first magnetization supply layer 2 of one cell are shown) of each of the plurality of magnetic wall utilization spin MOSFETs 100. One first cell selection element 36 is provided for one magnetic wall utilization spin MOSFET 100. The first cell selection element 36 controls which magnetic wall utilization spin MOSFET 100 is to flow a write current. The first cell selection element 36 is grounded.

The second control element 37 is connected to the fourth wiring 24. The second control element 37 is connected to an external power supply which is not shown and controls the current flowing through the fourth wiring 24.

The second cell selection element 38 is connected to the readout electrode layer 10 via the respective third wirings 23 of the plurality of magnetic wall utilization spin MOSFETs 100. One second cell selection element 38 is provided for one magnetic wall utilization spin MOSFET 100. The second cell selection element 38 controls which magnetic wall utilization spin MOSFET 100 is to flow the read current. The second cell selection element 38 is grounded.

The third control element 39 is connected to the fifth wiring 25. The second control element 39 is connected to an external power supply which is not shown, and controls the voltage applied to the gate electrode 8.

Known switching elements can be used for the first control element 35, the second control element 37, the third control element 39, the first cell selection element 36, and the second cell selection element 38. For example, a transistor element and the like such as a field effect transistor or the like can be used.

Hereinafter, with reference to FIG. 13, a writing operation and a reading operation by the magnetic wall utilization analog memory will be described.

The write operation is controlled by the first control element 35 and the first cell selection element 36.

First, the first control element 35 is opened (connected), and the first cell selection element 36 to be opened is selected. The first control element 35 is connected to an external power supply, and the first cell selection element 36 is grounded. Therefore, the write current flows in the order of the first control element 35, the first wiring 21, the second magnetization supply layer 3, the magnetic wall driving layer 1, the second wiring 22, and the selected first cell selection element 36. Descriptions of the case of flow of the current in reverse will be omitted.

The reading operation is controlled by the second control element 37, the second cell selection element 38, and the third control element 39.

First, the second control element 37 is opened (connected), and the second cell selection element 38 to be opened is selected. Next, the third control element 39 is opened (connected). The second control element 37 is connected to an external power supply, and the second cell selection element 38 is grounded. Therefore, the write current flows in the order of the second control element 37, the fourth wiring 24, the magnetization fixed layer 7, the channel layer 5, the magnetization free layer 6, the magnetic wall driving layer 1, the readout electrode layer 10, and the selected second cell selection element 38. Descriptions of a case in which the flow of current is reversed will be omitted.

The second control element 37, the second cell selection element 38, and the third control element 39 function as a reading mechanism.

In the magnetic wall utilization analog memory of the present embodiment, a bipolar element may be connected to either one of the first magnetization supply layer 2 and the second magnetization supply layer 3. With such a configuration, it is possible to shift the magnetic wall in an arbitrary direction by changing the direction of the current.

Regarding the magnetic wall utilization spin MOSFET and the magnetic wall utilization analog memory of the present embodiment, when comparing with the spin MOSFET and a conventional magnetic wall driving magnetoresistive effect element and a magnetic wall driving magnetic memory having such a magnetoresistive effect element in each cell, the only difference in the main structure is having the readout electrode layer 10 (and the tunnel barrier layer), and they can be manufactured by a known manufacturing method.

(Nonvolatile Logic Circuit)

The nonvolatile logic circuit of the present embodiment includes the magnetic wall utilization analog memory in which the magnetic wall utilization spin MOSFET of the present embodiment is arranged in an array and an STT-MRAM, and has a memory function and a logic function. As the memory function, the magnetic wall utilization analog memory and the STT-MRAM are provided.

Since the magnetic wall utilization analog memory and the STT-MRAM can be manufactured by the same process, the cost can be reduced. Also, by installing the digital STT-MRAM in the same circuit as the magnetic wall utilization analog memory arranged in an array form, the input/output can be digitized and the logic can be formed that can be processed internally in analog is formed.

(Magnetic Neuron Element)

FIG. 14 is a schematic cross-sectional view of an example of a magnetic neuron element according to an embodiment of the present embodiment.

The magnetic neuron element of the present embodiment includes the magnetic wall utilization spin MOSFET of the present embodiment, and the third region $1c$ of the magnetic wall driving layer 1 includes a first memory portion $41b$, and a second memory portion $41a$ and a third memory portion $41c$ sandwiching the first memory portion $41b$ therebetween, and the portions are arranged side-by-side in the longitudinal direction. In addition, the magnetic neuron element includes a current source (not shown) having a control circuit which is controllable of a flow of a write current capable of shifting magnetic walls sequentially such that the magnetic walls remain in all the memory portions of the first memory portion $41b$, the second memory portion $41a$, and the third memory portion $41c$ at least once.

The first memory portion $41b$ is a portion of the third region $1c$ of the magnetic wall driving layer 1 that overlaps with the magnetization free layer 6 in a plan view, the second memory portion $41a$ is a portion between the magnetization free layer 6 and the first magnetization supply layer 2 in a plan view (portion not overlapping with the magnetization free layer 6 and the first magnetization supply layer 2), and the third memory portion $41c$ is a portion between the magnetization free layer 6 and the second magnetization supply layer 3 (portion not overlapping with the magnetization free layer 6 and the second magnetization supply layer 3).

The magnetic wall utilization spin MOSFET of the present embodiment can be used as a magnetic neuron element which is an element simulating the operation of a synapse. In the synapse, it is preferable to have a linear output against external stimuli. Also, when the reversed load is applied, preferably, the synapse is reversed without hysteresis. As shown in FIG. 9, the area of a portion where the magnetization directions of the magnetization free layer 6 and the magnetic wall driving layer 1 are parallel is continuously changed by driving (shifting) the magnetic wall. That is, a parallel circuit is formed by the area of the portion where the magnetization directions of the magnetization free layer 6 and the magnetic wall driving layer 1 are parallel and the area of the portion where the magnetization directions of the magnetization free layer 6 and the magnetic wall driving layer 1 is antiparallel to each other. The horizontal axis of FIG. 9 can be regarded as the driving distance of the magnetic wall, and can exhibit a relatively linear resistance change. Since the driving of the magnetic wall can be driven depending on the magnitude of the current and the time of the applied current pulse, the magnitude and direction of the current and the time of the applied current pulse can be regarded as the external load.

(Initial Memory Stage)

For example, when the magnetic wall of the magnetic wall driving layer 1 is maximally shifted in the −X direction, the magnetic wall is stabilized at the end $41a$ A on the magnetization free layer 6 side of the first magnetization supply layer 2. When a current is made to flow from the second magnetization supply layer 3 to the first magnetization supply layer 2, electrons flow from the first magnetization supply layer 2 to the second magnetization supply layer 3, and spin-polarized electrons at the inside of the first magnetization supply layer 2 and the magnetic wall driving layer 1 cause spin transfer to the magnetic wall, and the magnetic wall shifts in the +X direction. The readout resistance does not change even if the magnetic wall shifts until the magnetic wall reaches the end $41a$B on the side of the first magnetization supply layer 2 of the magnetization free layer 6. This state can be called the initial memory stage. In other words, the case where the magnetic wall is arranged in the second memory portion $41a$ can be called an initial memory stage. In the initial memory stage, the data is not recorded; however, the data is ready to be recorded.

(Main Memory Phase)

While the magnetic wall passes through the upper portion (the portion overlapping in plan view) of the magnetization free layer 6, the resistance at the time of readout changes as shown in FIG. 9. The current is supplied from the second magnetization supply layer 3 to the first magnetization supply layer 2, so that a load from the outside is obtained, and at the time of reading, a resistance change which is substantially proportional to the load is obtained. This is the main memory stage. That is, the case where the magnetic walls are arranged in the first memory portion $41b$ can be called the memory main memory stage. The state in which the magnetic wall is outside the end portion of the magnetization free layer 6 can be defined as stored or not stored, and the state where the magnetic wall is outside the end portion of the magnetization free layer 6 on the opposite side is can be defined as not stored or sored.

Needless to say, if the current flowing between the second magnetization supply layer 3 and the first magnetization supply layer 2 is reversed, the opposite action is obtained.

(Deepening Memory Phase)

Even when the magnetic wall reaches the end $21c$B on the side of the second magnetization supply layer 3 of the magnetization free layer 6 and shifts in the direction away from the magnetization free layer 6, the output at the time of reading does not change. However, after the magnetic wall is separated from the magnetization free layer 6, the output at the time of reading does not change until the magnetic wall reaches the end portion $41c$B of the magnetization free layer 6 even if a reverse load is applied. That is, it means that the memory will not be lost even if the external load is given, and this can be called the memory deepening stage. That is, it means that memory will not be lost even if an external load is given, and this can be called the memory deepening stage. That is, the case where the magnetic walls are arranged in the third memory portion $41c$ can be called the memory deepening stage.

When the current flowing between the second magnetization supply layer 3 and the first magnetization supply layer 2 is reversed, the correspondence between the initial memory stage, the main memory stage, and the memory deepening stage, and each memory portion is reversed.

In order to obtain the magnetic neuron element of the present embodiment by using the magnetic wall utilization spin MOSFET of the present embodiment as an element simulating the operation of a synapse, it is necessary to provide a current source capable of applying a write current such that the shift of the magnetic wall sequentially passes through the steps from the initial memory stage, the main memory stage, and the memory deepening stage. The magnetic neuron element includes a current source (not shown) having a control circuit which is controllable of a flow of a write current capable of shifting magnetic walls sequentially such that the magnetic walls remain in all the memory portions of the first memory portion, the second memory portion, and the third memory portion at least once.

Depending on the condition of the write current, it is possible to determine how many times the magnetic wall passes through each of the first memory portion, the second memory portion, and the third memory portion.

(Memory Oblivion Phase)

Memory can be forgotten by shifting the magnetic wall of the magnetic wall driving layer 1 to the non-memory state. In addition, driving and disappearance of the magnetic wall can also be caused by applying external magnetic field, heat, and physical distortion. In the magnetic wall utilization spin MOSFET of the present embodiment, since the output shows a constant low resistance value and high resistance value, the memory and non-memory are determined by definition. In addition, in the case where the magnetic wall is shifted or eliminated by a method other than flowing a current to the magnetic wall driving layer 1, due to randomness, the correlation of information between the plurality of magnetic wall utilization spin MOSFETs is lost. These can be called the memory oblivion phase.

(Brain Using Magnetic Neuron Element)

The magnetic neuron element of the present embodiment simulates synaptic movements, and is a memory that can undergo an initial memory stage, a main memory stage, and a memory deepening stage. It is possible to simulate a brain by installing the magnetic wall utilization analog memory of the present embodiment on a plurality of circuits. It is possible to form a brain with a high degree of integration in an arrangement that is evenly arrayed vertically and horizontally like a general memory.

Figure 15:
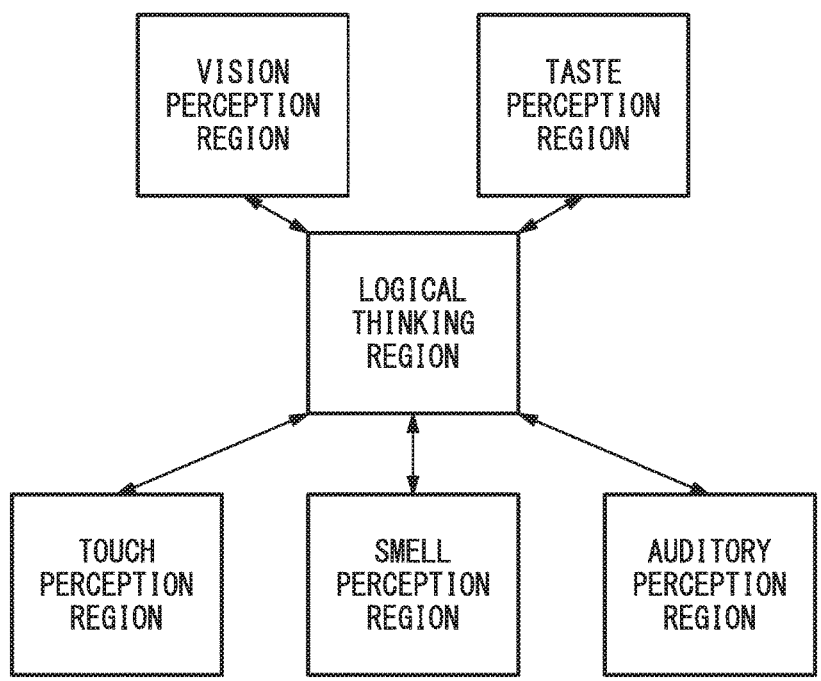
FIG. 15 is a diagram showing an artificial brain concept using a magnetic neuron element according to an embodiment of the present invention.

In addition, as shown in FIG. 15, it is possible to form brains with different degrees of recognition from external loads in an arrangement in which a plurality of magnetic neuron elements having specific circuits are arrayed as one block. For example, it is possible to create brain individuality such as a brain with high understanding of languages or a brain with high sensitivity for colors. In other words, by processing information obtained from an external sensor in the five-senses regions optimized for vision, taste, touch, smell, and auditory perception, and further judging in the logical thinking region, it is possible to form a process of determining the next behavior. Further, when the material of the magnetic wall driving layer 1 is changed, the driving speed of the magnetic wall for the load and a method of forming the magnetic wall are changed, so that it is possible to form an artificial brain whose change is the individuality thereof.

DESCRIPTION OF THE REFERENCE SYMBOLS

1: magnetic wall driving layer
1a: first region
1b: second region
1c: third region
2: first magnetization supply layer
3: second magnetization supply layer
5: channel layer
6: magnetization free layer
7: magnetization fixed layer
8: gate electrode
9: gate insulation layer
10: read electrode layer
11: high resistance layer
12: magnetic coupling layer
41a: second memory portion
41b: first memory portion
41c: third memory portion
100: magnetic wall utilization spin MOSFET
1000: magnetic wall utilization analog memory

The invention claimed is:

1. A magnetic wall utilization spin MOSFET comprising:
a magnetic wall driving layer comprising a magnetic wall, a first region, a second region, and a third region located between the first region and the second region;
a channel layer;
a magnetization free layer provided at a first end portion of a first surface of the channel layer, and arranged so as to be in contact with the third region of the magnetic wall driving layer;
a magnetization fixed layer provided at a second end portion opposite to the first end portion; and
a gate electrode provided between the first end portion and the second end portion of the channel layer through a gate insulating layer; and
a readout electrode layer provided at a position overlapping the magnetization free layer in plan view on a fourth surface of the magnetic wall driving layer opposite to a third surface of the magnetic wall driving layer on which the magnetization free layer is provided in the third region of the magnetic wall drive layer, the fourth surface being provided in the third region of the magnetic wall drive layer.

2. The magnetic wall utilization spin MOSFET according to claim 1, comprising a tunnel barrier layer between the channel layer and at least one of the magnetization free layer and the magnetization fixed layer.

3. The magnetic wall utilization spin MOSFET according to claim 1, further comprising a high resistance layer between the magnetic wall driving layer and the readout electrode layer arranged at a position overlapping with the magnetization free layer in plan view.

4. The magnetic wall utilization spin MOSFET according to claim 1, wherein a length of the magnetic wall driving layer is 60 nm or more.

5. The magnetic wall utilization spin MOSFET according to claim 1, further comprising:
a first magnetization supply layer which is in contact with the first region and has a first magnetization direction; and
a second magnetization supply layer which is in contact with the second region and has a second magnetization direction opposite to the first magnetization direction.

6. The magnetic wall utilization spin MOSFET according to claim 5, wherein a magnetization orientation of each of the magnetic wall driving layer, the first magnetization supplying layer, the second magnetization supplying layer, the magnetization free layer, and the magnetization fixed layer is parallel to each of the corresponding layers.

7. The magnetic wall utilization spin MOSFET according to claim 5, wherein a magnetization orientation of each of the magnetic wall driving layer, the first magnetization supplying layer, the second magnetization supplying layer, the magnetization free layer, and the magnetization fixed layer is perpendicular to each of the corresponding layers.

8. The magnetic wall utilization spin MOSFET according to claim 1, wherein the magnetic wall driving layer has a magnetic wall trapping portion.

9. The magnetic wall utilization spin MOSFET according to claim 5, wherein a bipolar element is connected to either one of the first magnetization supply layer and the second magnetization supply layer.

10. A magnetic wall utilization analog memory comprising a plurality of the magnetic wall utilization spin MOSFETs according to claim 1.

11. The magnetic wall utilization analog memory according to claim 10 comprising a mechanism reading a resistance change between the readout electrode layer and the magnetization free layer of a selected one of the plurality of the magnetic wall utilization spin MOSFETs at the time of reading.

12. A volatile logic circuit comprising a magnetic wall utilization analog memory in which the magnetic wall utilization spin MOSFET according to claim 1 is arranged in an array, and an STT-MRAM,
wherein the circuit has a memory function and a logical function, and as the memory function, comprises the magnetic wall utilization analog memory and the STT-MRAM.

13. A magnetic neuron element comprising the magnetic wall utilization spin MOSFET according to claim 1, wherein:
the third region of the magnetic wall driving layer comprises a first memory portion, and a second memory portion and a third memory portion arranged so as to sandwich the first memory portion therebetween, which are arranged side-by-side in the longitudinal direction; and
the magnetic neuron element comprises a current source having a control circuit which is controllable of a flow of a write current capable of shifting magnetic walls sequentially such that the magnetic walls remain in all the memory portions of the first memory portion, the second memory portion, and the third memory portion at least once.

14. A magnetic wall utilization spin MOSFET comprising:
a channel layer having a first surface and a second surface opposing each other;
a magnetic wall driving layer having a third surface and a fourth surface opposing each other, the magnetic wall driving layer comprising a magnetic wall, a first region, a second region, and a third region located between the first region and the second region;
a magnetization free layer provided at a first end portion of the first surface of the channel layer between the first surface and the third surface, and arranged so as to be in contact with the third region of the magnetic wall driving layer;
a magnetization fixed layer provided at a second end portion opposite to the first end portion;
a gate electrode provided between the first end portion and the second end portion of the channel layer through a gate insulating layer; and
a readout electrode layer provided to have the magnetic wall driving layer between the readout electrode layer and the magnetization free layer, the readout electrode layer being provided at a position overlapping the magnetization free layer in plan view on the fourth surface opposite to the third surface on which the magnetization free layer is provided in the third region of the magnetic wall drive layer, the fourth surface being provided in the third region of the magnetic wall drive layer.

* * * * *